US007593710B2

(12) United States Patent
Brigaud et al.

(10) Patent No.: US 7,593,710 B2
(45) Date of Patent: Sep. 22, 2009

(54) METHOD AND A DEVICE FOR CONTROLLING AMPLIFICATION OF A SIGNAL EMITTED BY A MOBILE TERMINAL AND INCREASING THE AUTONOMY OF THE MOBILE TERMINAL

(75) Inventors: Jean Claude Brigaud, Montreuil sur Epte (FR); Mikaël Pouliquen, Paris (FR); Bruno Lagoguez, Claix (FR)

(73) Assignee: IPG Electronics 504 Limited, St. Peter Port (GG)

( * ) Notice: Subject to any disclaimer, the term of this patent is extended or adjusted under 35 U.S.C. 154(b) by 1173 days.

(21) Appl. No.: 09/941,708

(22) Filed: Aug. 30, 2001

(65) Prior Publication Data

US 2002/0094850 A1    Jul. 18, 2002

(30) Foreign Application Priority Data

Aug. 31, 2000    (FR) .................................. 00 11120

(51) Int. Cl.
*H04B 1/16* (2006.01)
(52) U.S. Cl. ................. 455/343.5; 455/574; 455/343.1; 455/127.3
(58) Field of Classification Search ................. 455/571, 455/572, 573, 574, 343.1–5, 127.5, 127.3, 455/127.4, 126, 552.1, 115.3, 67.11, 115.1, 455/115.2, 129, 69, 80, 82, 522, 343.5, 127.1–3; 330/129, 141

See application file for complete search history.

(56) References Cited

U.S. PATENT DOCUMENTS

| 5,214,393 | A | * | 5/1993 | Aihara | 455/126 |
| 5,334,945 | A | * | 8/1994 | Yokoya et al. | 330/129 |
| 5,524,287 | A | * | 6/1996 | Yokoya et al. | 455/126 |
| 5,574,993 | A | * | 11/1996 | Kobayashi et al. | 455/126 |
| 5,715,527 | A | * | 2/1998 | Horii et al. | 455/126 |
| 5,999,829 | A | * | 12/1999 | Chun et al. | 455/572 |
| 6,038,428 | A | * | 3/2000 | Mizusawa et al. | 455/69 |
| 6,334,050 | B1 | * | 12/2001 | Skarby | 455/126 |
| 6,580,901 | B1 | * | 6/2003 | Mochizuki | 455/127.1 |
| 6,701,138 | B2 | * | 3/2004 | Epperson et al. | 455/572 |

FOREIGN PATENT DOCUMENTS

EP    0 392 079 A2    10/1990
EP    0 525 962 A2    2/1993

* cited by examiner

*Primary Examiner*—John J Lee
(74) *Attorney, Agent, or Firm*—Volpe and Koenig, PC

(57) ABSTRACT

A method of controlling amplification of a signal emitted by a radiocommunication terminal including a power amplifier and a power supply battery includes the steps of detecting the output power of the amplifier and converting the output power into a detected voltage, comparing the detected voltage with a set point voltage, and adapting the input power of the power amplifier as a result of the comparison. The detected voltage and/or the set point voltage is rendered dependent on the voltage of the power supply battery during the step of detecting and converting the output power of the amplifier.

12 Claims, 3 Drawing Sheets

METHOD AND A DEVICE FOR CONTROLLING AMPLIFICATION OF A SIGNAL EMITTED BY A MOBILE TERMINAL AND INCREASING THE AUTONOMY OF THE MOBILE TERMINAL

CROSS-REFERENCE TO RELATED APPLICATIONS

This application is based on French Patent Application No. 00 11 120 filed Aug. 31, 2000, the disclosure of which is hereby incorporated by reference thereto in its entirety, and the priority of which is hereby claimed under 35 U.S.C. §119.

BACKGROUND OF THE INVENTION

1. Field of the Invention

The present invention relates to wireless terminals, such as mobile telephones, and more particularly to a method and a device for controlling amplification of the signal emitted by a mobile terminal and reducing the power drawn from the power supply battery of the terminal.

2. Description of the Prior Art

Mobile telephones include a power amplifier in order to be able to transmit a signal of sufficient power during calls.

To send and receive calls, each telephone must be connected continuously to a fixed terminal. The greater the distance from the telephone to the fixed terminal, the higher the power required.

According to the specifications of the Global System for Mobile communications (GSM), a terminal operating on the GSM network must be able to transmit a maximum power of 33 dBm. The maximum power can be reduced to 30.5 dBm in the event of extreme conditions, i.e. if the battery voltage is low.

Thus if the telephone is very far away from the fixed terminal to which it is connected, the latter will cause the telephone to transmit at maximum power in order to ensure correct operation.

However, the higher the required transmitted power, the greater the amplification required in the terminal, and therefore the greater the load on the battery of the terminal. This leads to high power consumption from the battery and therefore a significant reduction in the autonomy of the telephone.

Against this background, an object of the present invention is to alleviate the above drawback by proposing a method and a device for amplifying a signal emitted by a mobile terminal and which reduce the power drawn from the battery of the terminal.

SUMMARY OF THE INVENTION

To this end, in accordance with the invention, a method of controlling amplification of a signal emitted by a radiocommunication terminal including a power amplifier and a power supply battery includes the steps of:
  detecting the output power of the amplifier and converting the output power into a detected voltage,
  comparing the detected voltage with a set point voltage, and
  adapting the input voltage of the power amplifier as a result of the comparison,
  in which method the detected voltage and/or the set point voltage is rendered dependent on the voltage of the power supply battery before the step of comparing the detected voltage with the set point voltage.

In a first embodiment the detected voltage is increased by a correction value dependent on the voltage of the power supply battery.

In a second embodiment the set point voltage is reduced by a correction value dependent on the voltage of the power supply battery.

The correction value is preferably a multiple of (Vbat−Vnom) where (Vbat) is the voltage of the power supply battery and (Vnom) is the nominal voltage of the power supply battery.

The detected voltage and/or the set point voltage is preferably rendered dependent on the voltage of the power supply battery only in a range of the output power of the amplifier close to 30 dBm.

The invention also provides a device for controlling amplification of a signal emitted by a terminal which includes a power amplifier, means for detecting the power at the output of the amplifier and converting the power into a detected voltage, means for comparing the detected voltage with a set point voltage, means for controlling the input voltage of the amplifier, and a power supply battery, which device includes means for rendering the detected voltage or the set point voltage dependent on the voltage of the power supply battery before comparing the detected voltage with the set point voltage.

In a first embodiment the means for taking into account the voltage of the power supply battery include a subtractor between the comparator means and the power detector and converter means.

The device advantageously further includes blocking means adapted to render the detected voltage or the set point voltage dependent on the voltage of the power supply battery only in a range of the output power of the amplifier close to 30 dBm, and the blocking means preferably include a field-effect transistor.

In a second embodiment the means for rendering the detected voltage or the set point voltage dependent on the voltage of the power supply battery include software means only in a range of powers close to 30 dBm.

The invention further provides a radiocommunication terminal including an amplification control device according to the invention.

The invention will be better understood in the light of the following description, which relates to illustrative but non-limiting embodiments of the invention and is given with reference to the accompanying drawings.

DETAILED DESCRIPTION OF THE PREFERRED EMBODIMENTS

Figure 1:
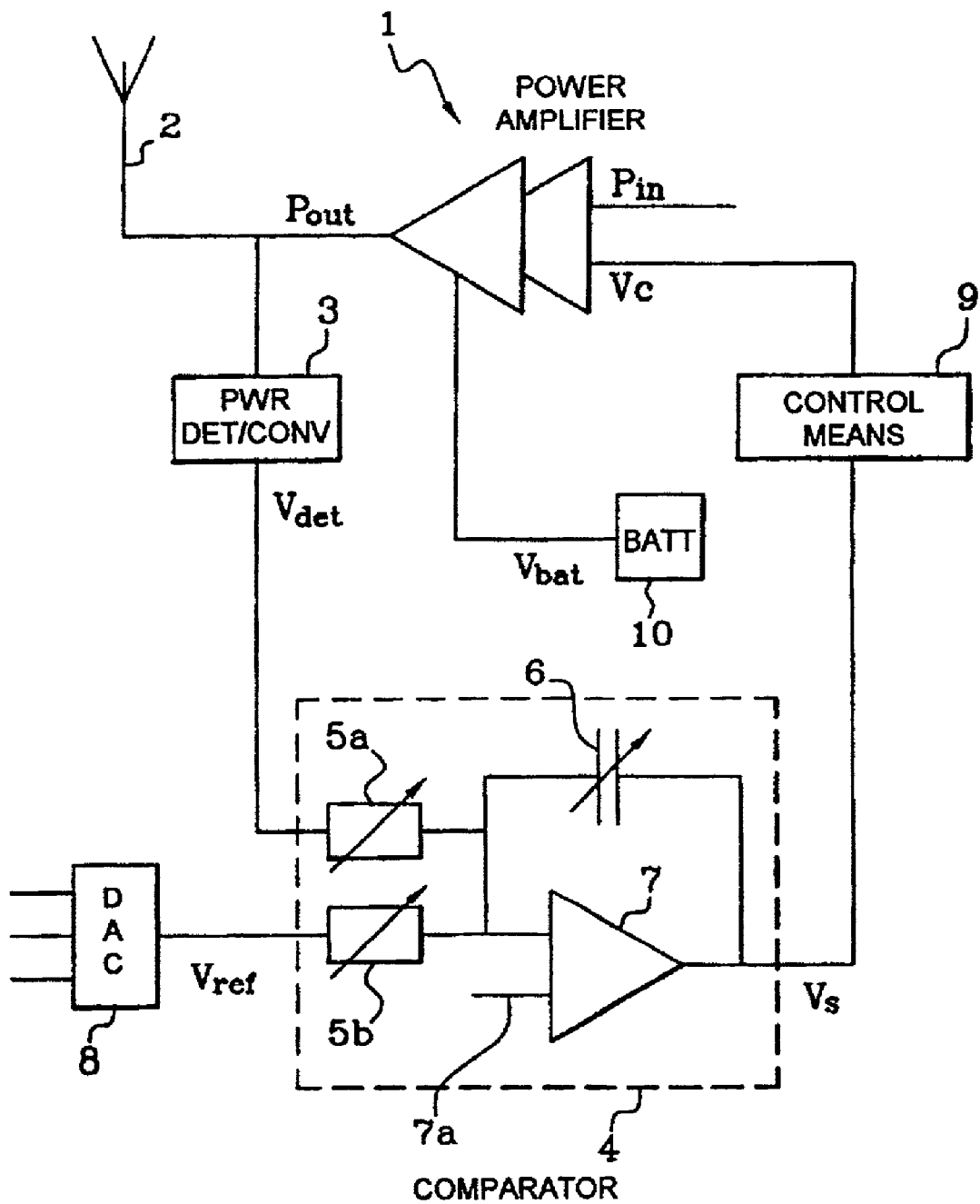
FIG. 1 is a block diagram of a device for implementing a prior art method of controlling amplification of a signal emitted by a mobile terminal.

FIG. 1 shows diagrammatically a prior art device implementing a method of controlling amplification of a signal emitted by a mobile terminal such as a mobile telephone.

The signal is amplified by a power amplifier 1 fed with a constant input power (Pin) from a preamplifier (not shown) and delivering an output power (Pout) via the antenna 2 of the mobile terminal.

The device also includes power detecting and converting means 3 at the output of the power amplifier 1. The power detecting and converting means 3 detect the output power (Pout) of the power amplifier 1 and convert it to a voltage (Vdet) corresponding to the voltage detected at the output of the power detecting and converting means 3.

The detected output voltage (Vdet) is then fed to a comparator 4 which can be of a type known in the art.

The comparator 4 includes two variable resistors 5a, 5b whose respective resistances can be identical, a variable capacitor 6, and an operational amplifiers 7, one input 7a of which is grounded.

The two inputs of the comparator 4 are therefore the detected voltage (Vdet) imaging the power (Pout) at the output of the power amplifier 1 and a set point or reference voltage (Vref) obtained in a manner known in the art from a digital/analog converter 8.

The comparator 4 delivers an output voltage (Vs) depending on the result of the comparison of (Vdet) and (Vref) to control means 9.

The control means 9 consist of a control circuit for varying the controlled voltage (Vc) at the input of the power amplifier 1 in accordance with the output voltage (Vs) of the comparator 4.

The power amplifier 1 is also connected to a power supply battery 10 delivering a voltage (Vbat).

Accordingly, the amplifier 1 draws more or less power from the power supply battery 10 according to the amplification to be applied to the signal. In the particular case where the mobile terminal is far away from the fixed terminal to which it is connected, the emitted power (Pout) must be at a maximum, i.e. at 33 dBm according to the recommendations of the GSM standard.

That maximum power required by the fixed terminal leads to high power consumption from the power supply battery 10, significantly reducing the autonomy of the mobile terminal (i.e. its talk and standby time before charging the battery).

Figure 2:
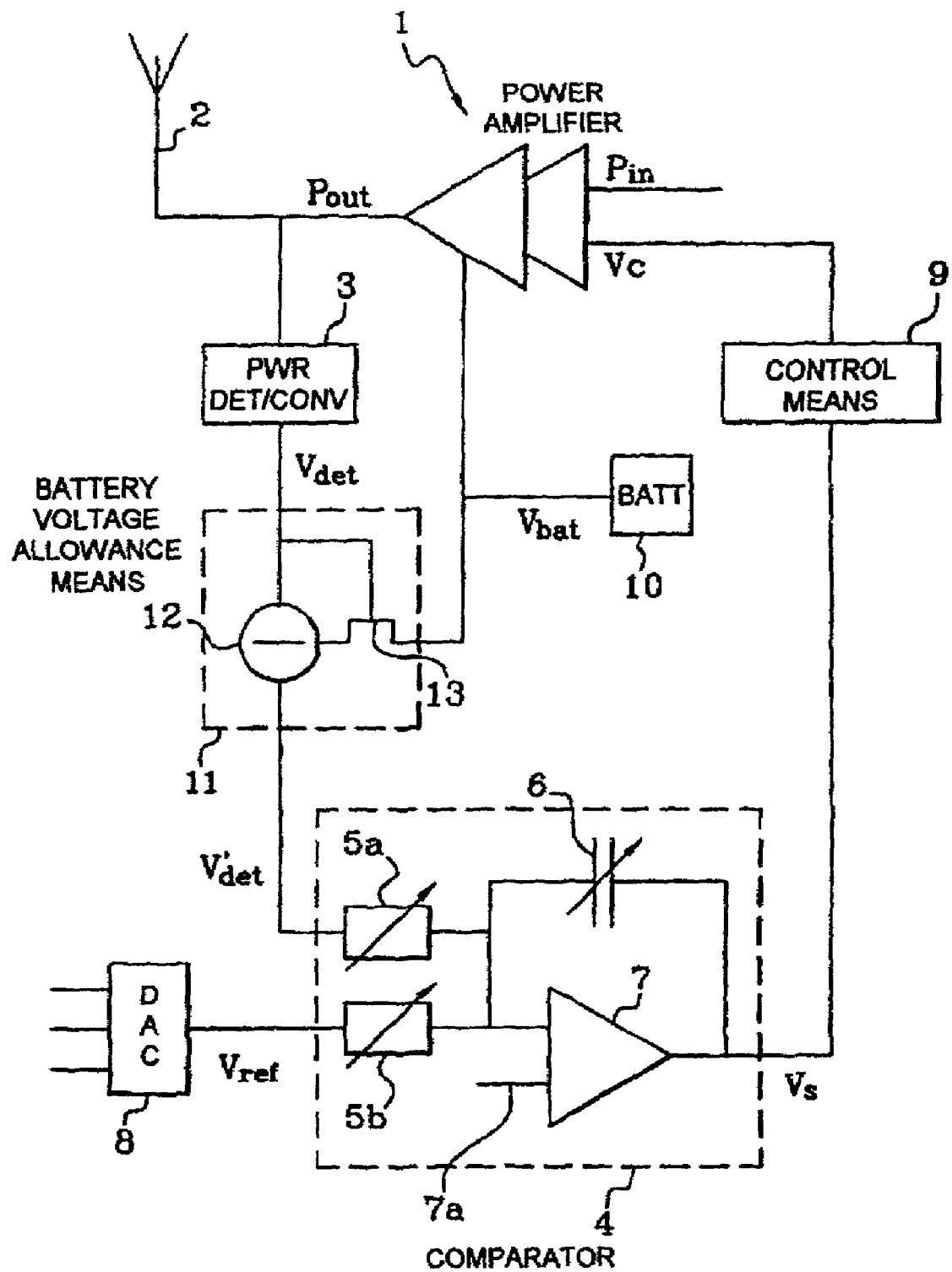
FIG. 2 is a block diagram of a first embodiment of a device for implementing a method according to the invention.

FIG. 2 is a diagrammatic representation of a first embodiment of a device for implementing a method in accordance with the invention of controlling amplification of a signal emitted by a mobile terminal.

Components in FIG. 2 identical to those of FIG. 1 retain the same reference numbers.

Thus the device includes the power amplifier 1, the detector and converter means 3, the comparator 4, the control circuit 9 and the power supply battery 10.

The essential difference compared to the prior art device concerns the detection/conversion of the output power (Pout) of the power amplifier 1.

In fact, the device according to the invention includes means 11 adapted to take account of the voltage (Vbat) of the power supply battery 10 when detecting/converting the output power of the power amplifier 1.

The means 11 include a subtractor module 12 and blocking means consisting of a field-effect transistor 13, for example. The term "blocking" means that, below a particular power threshold (Pout), the field-effect transistor is not conducting and blocks the effect of the subtractor.

The subtractor module 12 and the field-effect transistor 13 are both connected to the circuit between the means 3 for detecting the output voltage of the power amplifier 1 and the input of the comparator 4.

The subtractor module 12 is configured to deliver an output voltage (V'det) such that:

$$(V'det) = (Vdet) - K(Vbat - Vnom)$$

where:
  (Vdet) is the voltage detected immediately at the output of the detector means 3;
  K is a positive multiplier coefficient; and
  (Vnom) is the nominal voltage of the power supply battery 10.

Accordingly, the lower the power supply battery voltage (Vbat), the greater the difference (Vbat)−(Vnom).

Taking account of the power supply battery voltage (Vbat) therefore reduces the difference between the set point voltage (Vref) and the voltage detected at the output of the detector and converter means 3.

Accordingly, the voltages (V'det) and (Vref) are closer together, the power amplification from (Pin) to (Pout) is lower, and there is less demand on the power supply battery 10.

Because there is less demand on the battery 10, its autonomy is increased commensurately.

According to the recommendations of the GSM standard, under certain conditions it is possible to emit a maximum power less than that specified (33 dBm), in particular if the battery voltage (Vbat) is low.

The field-effect transistor 13 renders the device operational only for a particular range of output power (Pout).

In fact, the field-effect transistor 13 is conducting (and the battery voltage (Vbat) is therefore taken into account) only for high values of the output power (Pout), for example from 30 dBm.

Thanks to this configuration, the output power (Pout) of the amplifier 1 depends on the voltage (Vbat) of the battery 10 as soon as the transistor 13 is turned on, i.e. as soon as the necessary output power (Pout) reaches a certain level.

Accordingly, for lower output powers (Pout), the transistor 13 does not conduct: the voltage (Vbat) of the power supply battery 10 is then not taken into account and the device operates in accordance with the prior art method.

Figure 3:
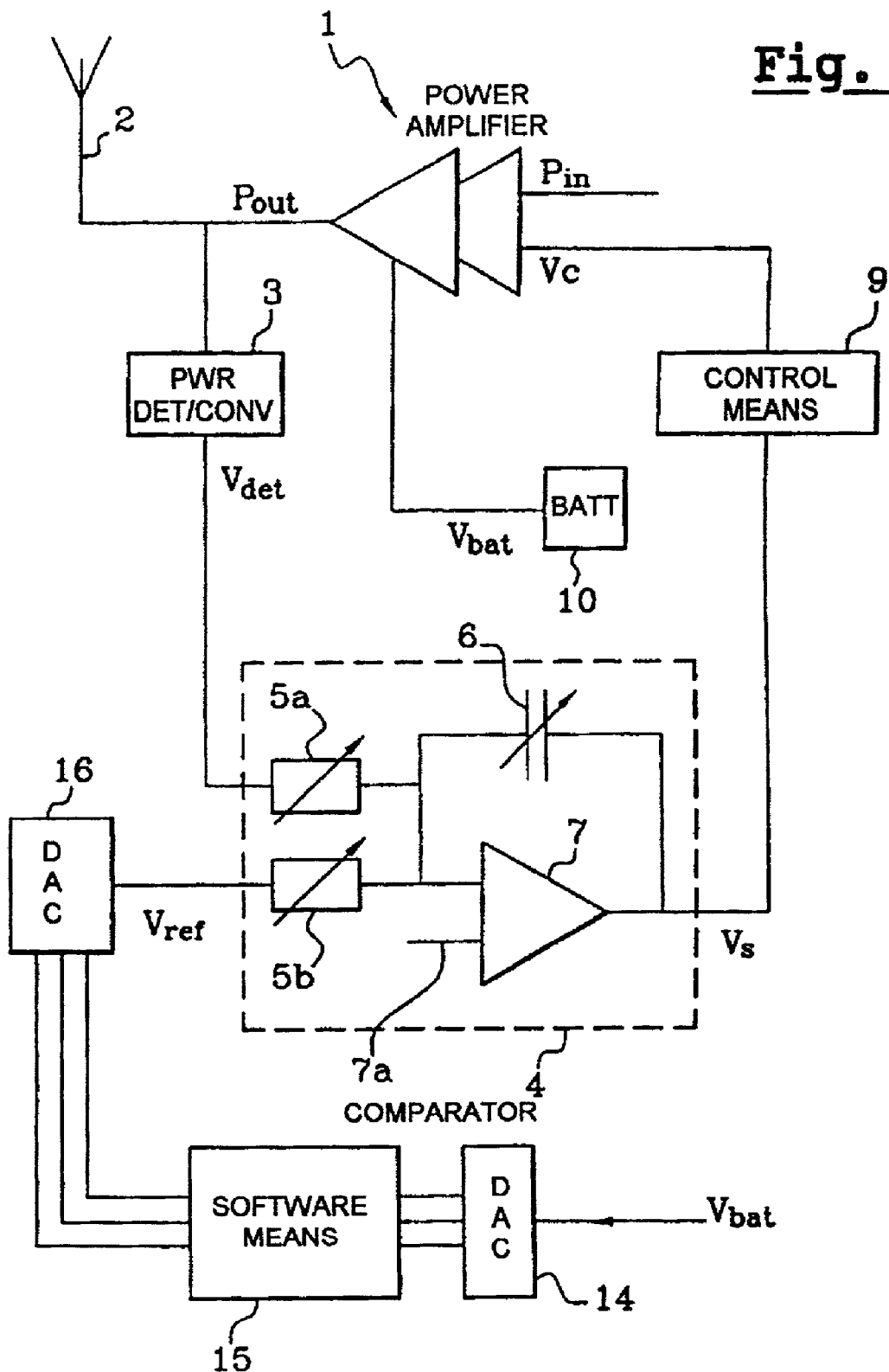
FIG. 3 is a block diagram of a second embodiment of a device for implementing a method according to the invention.

FIG. 3 is a diagrammatic representation of a second embodiment of a device for implementing a method in accordance with the invention of controlling amplification of a signal emitted by a mobile terminal.

Once again, components identical to those of FIGS. 1 and 2 retain the same reference numbers.

In FIG. 3, the voltage (Vbat) of the power supply battery is taken into account when the set point voltage (Vref) is established.

The power supply battery voltage (Vbat) is passed through a digital/analog converter 14, after which software means 15 which are known in the art employ an algorithm to establish a set point voltage (Vref) as a function of the output power level (Pout) of the amplifier 1 and the power supply battery voltage (Vbat).

In this embodiment the detected voltage (Vdet) is unchanged.

Simplifying, the algorithm employed by the software means 15 can be of the following type, for example:

If (Pout)>(Plim),
  Then (Vref)'=(Vref)+K' (Vbat−Vnom)
  where:
  (Plim) is a limit value of the output power (Pout) of the amplifier 1, chosen by the manufacturer,
  (Vref) is the set point voltage when the battery voltage (Vbat) is not taken into account (i.e. when (Pout)< (Plim)),
  K' is a positive multiplier coefficient, and
  (Vnom) is the nominal voltage of the power supply battery 10.

There is another digital/analog converter 16 at the output of the software means 15 to provide the voltage (Vref) or (Vref)'. The software means 15 do not actually operate on these voltages but are used to control them.

Accordingly, from a limit value (Plim) of the output power (Pout) of the amplifier 1, the set point voltage (Vref) takes a value (Vref)' depending on the battery voltage (Vbat).

Because the coefficient K' is positive, the modified voltage (Vref)' is less than (Vref), which reduces the difference between the detected voltage (Vdet) and the set point voltage (Vref)', as in the first embodiment.

Because that difference is reduced, the amplification from the input power (Pin) to the output power (Pout) is lower.

There is therefore less demand on the power supply battery 10, increasing its autonomy.

Accordingly, for high powers (for example from 30 dBm), the device takes account of the voltage (Vbat) of the power supply battery 10 in order to limit the power amplification in order to draw less power from the power supply battery 10.

Another advantage of the device and the method according to the invention is that they prevent saturation of the power amplifier 1 if the mobile terminal is relatively close to the fixed terminal to which it is connected, for example.

The invention claimed is:

1. A method of controlling amplification of a signal emitted by a radio communication terminal including a power amplifier and a power supply battery, said method comprising the steps of:
    detecting an output power of said amplifier and converting said output power into a first detected voltage,
    modifying said first detected voltage based on an output voltage level of said power supply battery to generate a second detected voltage,
    comparing said second detected voltage with a set point voltage to generate a comparison result, and
    adapting an input voltage of said power amplifier based on said comparison result,
    wherein said first detected voltage is increased by a correction value dependent on said output voltage of said power supply battery to generate said second detected voltage.

2. The method claimed in claim 1 wherein said correction value is a multiple of Vbat−Vnom where Vnom is a nominal voltage of said power supply battery and Vbat is the output voltage of said power supply battery.

3. A method of controlling amplification of a signal emitted by a radio communication terminal including a power amplifier and a power supply battery, said method comprising the steps of:
    detecting an output power of said amplifier and converting said output power into a first detected voltage,
    modifying said first detected voltage based on an output voltage level of said power supply battery to generate a second detected voltage,
    comparing said second detected voltage with a set point voltage to generate a comparison result, and
    adapting an input voltage 6f said power amplifier based on said comparison result,
    wherein said set point voltage is reduced by a correction value dependent on said output voltage of said power supply battery.

4. The method claimed in claim 3 wherein said correction value is a multiple of Vbat−Vnom where Vnom is a nominal voltage of said power supply battery and Vbat is the output voltage of said power supply battery.

5. A method of controlling amplification of a signal emitted by a radio communication terminal including a power amplifier and a power supply battery, said method comprising the steps of:
    detecting an output power of said amplifier and converting said output power into a first detected voltage,
    modifying said first detected voltage based on an output voltage level of said power supply battery to generate a second detected voltage,
    comparing said second detected voltage with a set point voltage to generate a comparison result, and
    adapting an input voltage of said power amplifier based on said comparison result,
    wherein said first detected voltage is modified based on said output voltage of said power supply battery only within a limited range of the output power of said amplifier.

6. The method claimed in claim 5 wherein said first detected voltage is modified based on said output voltage of said power supply battery only in a range of the output power of said amplifier close to 30 dBm.

7. A device for controlling amplification of a signal emitted by a terminal, said device comprising:
    a power supply battery,
    a power amplifier,
    means for detecting an output power of said amplifier and converting said output power into a first detected voltage,
    means for modifying said first detected voltage based on an output voltage of said power supply battery to generate a second detected voltage;
    means for comparing said first detected voltage with a set point voltage to generate a comparison result, and
    means for controlling an input voltage of said amplifier based on said comparison result,
    wherein said means for modifying said first detected voltage based on said output voltage of said power supply battery include a subtractor between said comparator means and said power detector and converter means.

8. A device for controlling amplification of a signal emitted by a terminal, said device comprising:
    a power supply battery,
    a power amplifier,
    means for detecting an output power of said amplifier and converting said output power into a first detected voltage,
    means for modifying said first detected voltage based on an output voltage of said power supply battery to generate a second detected voltage;
    means for comparing said first detected voltage with a set point voltage to generate a comparison result, and
    means for controlling an input voltage of said amplifier based on said comparison result,
    wherein said means for modifying said first detected voltage based on said output voltage of said power supply battery modifies said first detected voltage only in a range of the output power of said amplifier close to 30 dBm.

9. The device claimed in claim 8 wherein said means for modifying said first detected voltage include a field-effect transistor.

10. A device for controlling amplification of a signal emitted by a terminal, said device comprising:
    a power supply battery,
    a power amplifier, means for detecting an output power of said amplifier and converting said output power into a first detected voltage, means for modifying said first detected voltage based on an output voltage of said power supply battery to generate a second detected voltage;

means for comparing said first detected voltage with a set point voltage to generate a comparison result, and means for controlling an input voltage of said amplifier based on said comparison result, wherein said means for modifying said first detected voltage based on said output voltage of said power supply battery include software means.

11. The device claimed in claim 10 wherein said software means modifies said first detected voltage based on said output voltage of said power supply battery only in a range of powers close to 30 dBm.

12. A radio communication terminal comprising a device for controlling amplification of a signal emitted by a terminal a power amplifier, the device comprising:

a power supply battery, a power amplifier, means for detecting an output power of said amplifier and converting said output power into a first detected voltage, means for modifying said first detected voltage based on an output voltage of said power supply battery to generate a second detected voltage;

means for comparing said first detected voltage with a set point voltage to generate a comparison result, and means for controlling an input voltage of said amplifier based on said comparison results, wherein said means for modifying said first detected voltage based on said output voltage of said power supply battery include a subtractor between said comparator means and said power detector and converter means.

* * * * *